(12) United States Patent
Williams

(10) Patent No.: US 6,639,432 B1
(45) Date of Patent: Oct. 28, 2003

(54) SELF CALIBRATING, ZERO POWER PRECISION INPUT THRESHOLD CIRCUIT

(75) Inventor: Timothy J. Williams, Bellevue, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/620,490

(22) Filed: Jul. 20, 2000

(51) Int. Cl.[7] .................................................. H03K 5/22
(52) U.S. Cl. ............................. 327/70; 327/72; 327/276
(58) Field of Search ............................. 327/70, 72, 74, 327/80, 90, 93, 112, 276, 277, 278, 281, 269, 270; 326/86, 82, 83, 87, 26, 27; 331/25

(56) References Cited

U.S. PATENT DOCUMENTS

| | | | | |
|---|---|---|---|---|
| 5,162,672 A | * | 11/1992 | McMahan et al. | 326/86 |
| 5,440,221 A | * | 8/1995 | Landau et al. | 320/22 |
| 5,539,349 A | * | 7/1996 | Roy | 327/276 |
| 5,543,795 A | * | 8/1996 | Fernald | 341/163 |
| 5,859,541 A | * | 1/1999 | McMahan et al. | 326/30 |
| 5,864,506 A | * | 1/1999 | Arcoleo et al. | 365/189.05 |
| 6,111,717 A | * | 8/2000 | Cloke et al. | 360/67 |
| 6,252,465 B1 | * | 6/2001 | Katoh | 331/25 |
| 6,335,633 B1 | * | 1/2002 | Kirsch | 326/34 |
| 6,501,325 B1 | * | 12/2002 | Meng | 327/536 |
| 6,504,406 B1 | * | 1/2003 | Kakitani | 327/536 |

OTHER PUBLICATIONS

Field Effect Devices. Robert F.Pierret. Addison–Wesley Publishing Company.1990.pp. 115–122.*

* cited by examiner

Primary Examiner—Tuan T. Lam
Assistant Examiner—Hiep Nguyen
(74) Attorney, Agent, or Firm—Christopher P. Maiorana, P.C.

(57) ABSTRACT

An apparatus comprising one or more input circuits. The input circuit may be configured to generate an output signal in response to (i) an input signal and (ii) an input threshold. The input threshold may be set in response to a control input.

20 Claims, 5 Drawing Sheets

SELF CALIBRATING, ZERO POWER PRECISION INPUT THRESHOLD CIRCUIT

FIELD OF THE INVENTION

The present invention relates to a method and/or architecture for input threshold circuits generally and, more particularly, to a method and/or architecture for a self-calibrating, zero power precision input threshold circuit.

BACKGROUND OF THE INVENTION

Input signals are presented to electronic circuits for control and communication purposes. The input signals may contain noise. The electronic circuits need to ignore changes in the input signal voltage levels that are caused by the noise. Electronic circuits include input circuits to differentiate between input is signal changes and noise. The input circuits differentiate input signal changes from noise using an input threshold voltage. When the input signal levels are above the input threshold voltage, the input circuit can present a first logic state (i.e., a logic LOW). When the input signals are below the input threshold voltage, the input circuit can present a second logic state (i.e., a logic HIGH). When a precise threshold is not required, a simple CMOS logic gate buffer is used for each input circuit. If precision thresholds are desired, the input circuits use a voltage comparator and a precision voltage reference.

Referring to FIG. 1, a schematic diagram of a circuit 10 illustrating a conventional CMOS input circuit is shown. The circuit 10 has a PMOS transistor 12 and a NMOS transistor 14. The input threshold voltage of the circuit 10 is determined by the threshold voltages (i.e., Vth) of the transistors 12 and 14. When an input signal IN has a voltage level below the threshold of the transistors 12 and 14, the transistor 12 conducts pulling the output signal OUT to a logic HIGH. When the signal IN has a level that is above the threshold of the transistors 12 and 14, the transistor 14 conducts pulling the signal OUT to a logic LOW. The input circuit 10 has a disadvantage of inherently imprecise threshold voltage control. The input threshold is dominated by process variation. Process variation can result in each CMOS input circuit of an integrated circuit having a different input threshold voltage level. Different input threshold voltage levels can cause inconsistent operation from input to input and chip to chip. The transistors of an integrated circuit (IC) can be tightly matched. Therefore, the variation between inputs on one chip can be much less than the chip to chip variation.

Referring to FIG. 2, a block diagram of a circuit 20 illustrating a conventional input circuit with a precise input threshold is shown. The circuit 20 has a voltage comparator 22 and a precision voltage reference circuit 24. When the signal IN has a voltage level that is greater than a level presented by the precision voltage reference 24, the comparator 22 presents the signal OUT in the first state (i.e., a logic LOW). When the signal IN has a voltage level that is lower than the level presented by the precision voltage reference 24, the comparator 22 presents the signal OUT in the second state (i.e., a logic HIGH). Disadvantages of the circuit 20 include: consuming DC power, requiring the precision voltage reference, and using a significant amount of area. The area penalty occurs for each input that is independently monitored.

The input circuit can require hysteresis for greater noise immunity. When the input circuit has hysteresis, the input signal must be above a first threshold (i.e., a high threshold) to be recognized as a logic HIGH and below a second threshold (i.e., a low threshold) to be recognized as a logic LOW. An input circuit with hysteresis that requires precise thresholds can require two precision voltage references and two voltage comparators, doubling the DC power consumption and area penalty.

An input circuit with a precise threshold voltage that could be implemented without using circuits that consume DC power and/or requiring a large area would be desirable.

SUMMARY OF THE INVENTION

The present invention concerns an apparatus comprising one or more input circuits. The input circuits may have minimal DC power consumption and may be configured to generate an output signal in response to an input signal and an input threshold. The input threshold may be adjusted in response to a control signal.

The objects, features and advantages of the present invention include a method and/or architecture for a self-calibrating, zero power precision input threshold circuit that may provide (i) a precise input threshold voltage, (ii) no standby power consumption after calibration is completed, (iii) self-calibrating input circuits, (iv) efficient area implementation of precision threshold input circuits, (v) tight thresholds over many inputs without multiplexing, (vi) user initiated re-calibration, (vii) a threshold set to either an absolute value or a percentage of supply voltage level, (ix) no additional external components required, and/or (x) an input circuit that may be calibrated during or after the manufacturing process.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
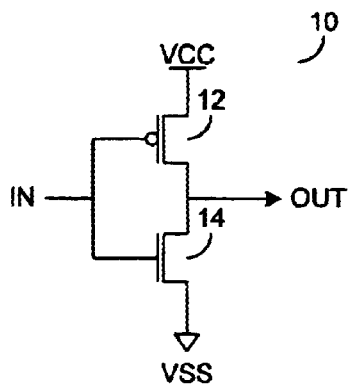
FIG. 1 is a schematic diagram illustrating a conventional CMOS input circuit.
Figure 2:
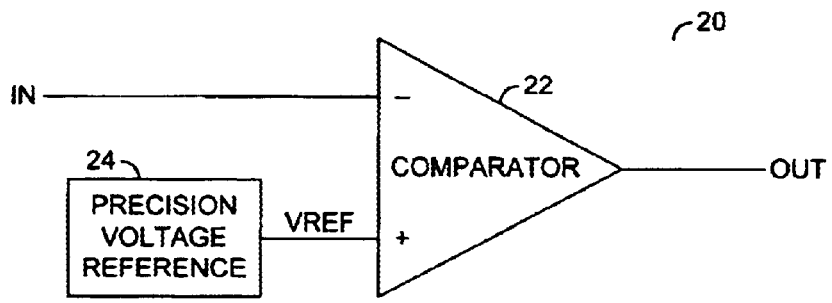
FIG. 2 is a block diagram illustrating a conventional precision threshold input circuit.
Figure 3:
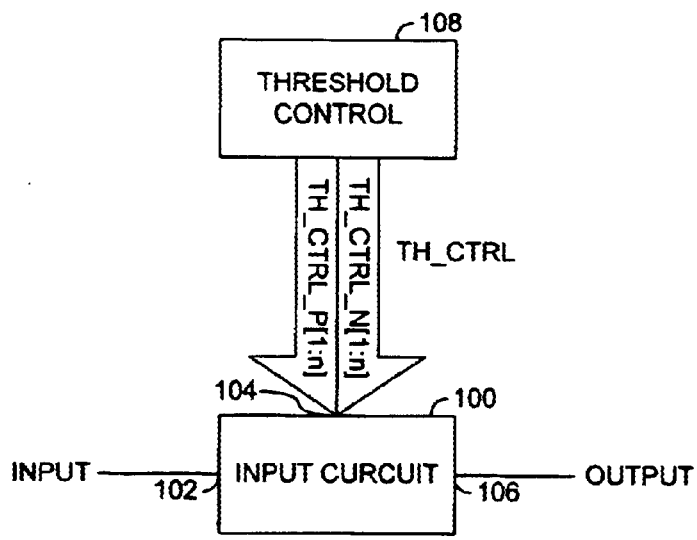
FIG. 3 is a block diagram illustrating an input circuit in accordance with a preferred embodiment of the present invention.

Referring to FIG. 3, a block diagram of a circuit 100 illustrating an input circuit in accordance with a preferred embodiment of the present invention is shown. The circuit 100 may be a zero power consumption input circuit with an input threshold that may be precisely set. Zero power consumption (or low power consumption) generally refers to a low power state where power consumption of a circuit is generally (i) dominated by device leakage and (ii) so far below normal operating power of the circuit that the power consumption may be considered negligible. In one example, the circuit 100 may comprise a number of switchable devices that may be configured to move the input threshold either up or down from a nominal value. For example, the circuit 100 may comprise a number of amplifier stages that may be switched on or off to raise or lower the input threshold. In one example, each of the amplifier stages may have a different gain.

The circuit 100 may have an input 102 that may receive a signal (e.g., INPUT), an input 104 that may receive a signal (e.g., TH_CTRL), and an output 106 that may present a signal (e.g., OUTPUT). The signal TH_CTRL may comprise, in one example, a number of bits. Each of the bits of the signal TH_CTRL may be used, in one example, as an individual control signal or as a single, multi-bit control signal. In one example, the signal TH_CTRL may comprise configuration bits. In one example, the circuit 100 may be implemented as an input circuit of a programmable logic device. 15 The threshold of the circuit 100 may be measured during the manufacturing process and a selected value of the signal TH_CTRL stored. For example, the signal TH_CTRL may be presented to the circuit 100 by a circuit 108.

The circuit 108 may comprise, in one example, a number of (i) volatile and/or non-volatile memory elements, (ii) bond options, (iii) fuse elements, or (iv) any other appropriate means for storing and presenting the signal TH_CTRL that meets the design criteria of a particular application. The signal TH_CTRL may be determined, in one example, according to predetermined criteria during the manufacture of the circuit 100. In one example, the signal TH_CTRL may be loaded from a non-volatile memory at each power-up.

In an alternative embodiment, the circuit 108 may comprise a calibration circuit that may eliminate the testing and storing steps during manufacture. The calibration circuit may be switched on to determine the signal TH_CTRL needed for a desired threshold. Once the calibration is completed, the calibration circuit may be switched off and generally draws no power. The calibration may be done, in one example, at power-up or in response to a user request (e.g., an enable signal). In one example, by placing the calibration circuit on a chip with one or more of the input circuit 100, the signal TH_CTRL may be selected by the calibration circuit as needed. When the circuit 108 includes the calibration circuit, the signal TH_CTRL may be stored in volatile memory.

The circuit 100 may be configured to generate the signal OUTPUT in response to the signal INPUT and a precision input threshold. The signal TH_CTRL may be used, in one example, to precisely adjust the input threshold of the circuit 100. In one example, the input threshold may comprise a voltage level in accordance with an I/O standard (e.g., TTL, CMOS, etc.). In another example, the input threshold may be set at a predetermined fraction of a supply voltage (e.g., VCC/2). However, other types of thresholds may be implemented accordingly to meet the design criteria of a particular application.

The circuit 100 may be implemented, in one example, as an input circuit with hysteresis. Hysteresis is the measure for a comparator for which an input threshold changes as a function of the input (or output) level. More specifically, when the input passes the input threshold, the output changes state and the input threshold is subsequently reduced so that the input must return beyond the initial input threshold before the output of the comparator changes state again.

When the circuit 100 is configured to provide hysteresis, the input threshold of the circuit 100 may comprise, in one example, a first (high) threshold (e.g., 52% of VCC) and a second (low) threshold (e.g., 48% of VCC). The signal TH_CTRL may comprise, in one example, a first portion (e.g., TH_CTRL_P) that may be used to control the first threshold and a second portion (e.g., TH_CTRL_N) that may be used to control the second threshold. Each of the portions TH_CTRL_P and TH_CTRL_N may be, in one example, N-bits wide, where N is an integer (e.g., TH_CTRL_P[1:n] and TH_CTRL_N[1:n]).

Figure 4:
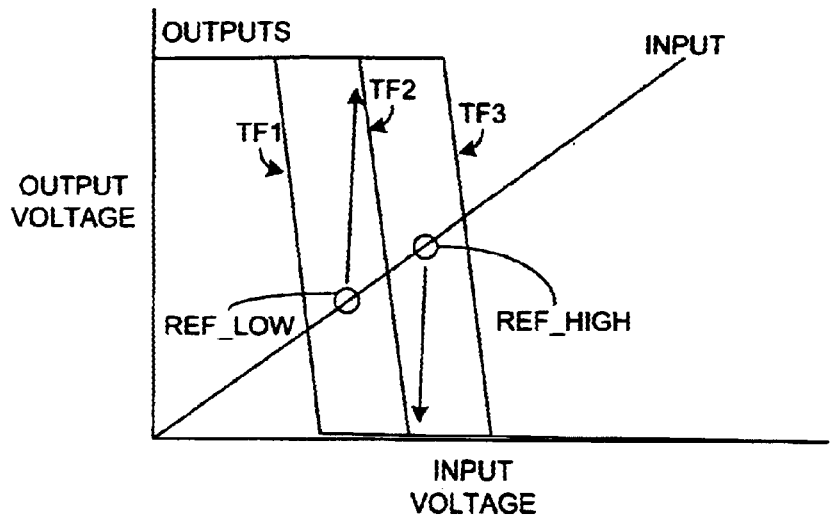
FIG. 4 is a line graph illustrating example transfer functions for an input circuit of FIG. 3.

Referring to FIG. 4, a line graph illustrating example transfer functions of the circuit 100 is shown. The signal OUTPUT may be generated having a first state and a second state. The signal OUTPUT may change states at different levels of the signal INPUT in response to different settings of the signal TH_CTRL (e.g., traces TF1, TF2, and TF3). A particular setting for the signal TH_CTRL may be selected to provide a particular response. In one example, averaging may be used to select a particular setting of the signal TH_CTRL when more than one setting provides a desired transition point for the signal OUTPUT. For example, the setting TF2 may be selected to provide a logic HIGH output when the signal INPUT is at a low reference level (e.g., REF_LOW) and a LOW output when the signal INPUT is at a high reference level (e.g., REF_HIGH). A calibration circuit (described in more detail in connection with FIGS. 6 and 7) may be used to select the signal TH_CTRL that may provide a desired response. The calibration circuit may be used during a manufacturing step or may be included in the apparatus with the circuit 100.

Figure 5A:
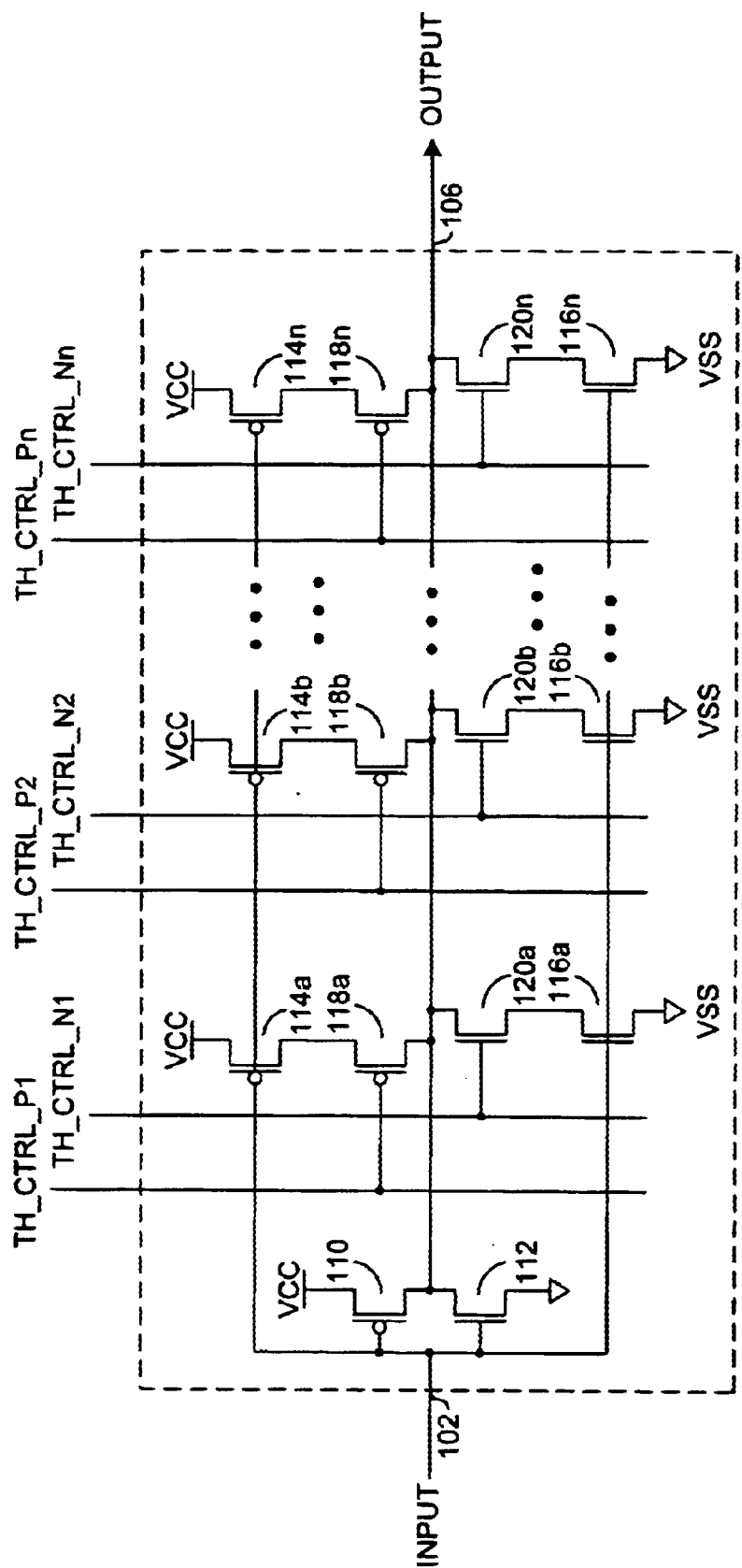
FIG. 5a is a schematic diagram of an input circuit of FIG. 3 illustrating a preferred embodiment of the present invention.

Referring to FIG. 5a, a schematic diagram of the circuit 100 illustrating a preferred embodiment of the present invention is shown. In one example, the circuit 100 may comprise a transistor 110, a transistor 112, a number of transistors 114a–114n, a number of transistors 116a–116n, a number of transistors 118a–118n, and a number of transistors 120a–120n. The transistors 110, 114a–114n, and 118a–118n may be implemented, in one example, as one or more PMOS transistors. The transistors 112, 116a–116n, and 120a–120n may be implemented, in one example, as one or more NMOS transistors. However, other types and polarity transistors may be implemented to met the design criteria of a particular application.

The signal INPUT may be presented to a gate of the transistors 110, 112, 114a–114n, and 116a–116n. A source of the transistors 110 and 114a–114n may be connected to a supply voltage (e.g., VCC). A source of the transistors 112 and 116a–116n may be connected to a voltage supply ground (e.g., VSS). A drain of the transistors 114a–114n may be connected to a source of the transistors 118a–118n, respectively. A drain of the transistors 116a–116n may be connected to a source of the transistors 120a–120n, respectively. Each bit of the signal TH_CTRL_P[1:n] may be presented to a respective gate of the transistors 118a–118n. Each bit of the signal TH_CTRL_N[1:n] may be presented to a respective gate of the transistors 120a–120n. A drain of the transistors 110, 112, 118a–118n, and 120a–120n may be connected together to form an output node that may be connected to the output 106. The signal OUTPUT may be presented at the output node.

The transistors 114a–114n may be implemented, in one example, with scaled widths (e.g., 1.0×, 0.5×, 0.25×, etc.). The transistors 116a–116n may also be implemented, in one example, with scaled widths (e.g., 1.0×, 0.53×, 0.25×, etc.). The scaling of the transistors 114a–114n may be the same or different from the scaling of the transistors 116a–116n. The transistors 114a–114n and 116a–116n may be scaled to provide finer and finer resolution of the input threshold. The scaling of the transistors 114a–114n and 116a–116–n may be implemented to meet the design criteria of a particular application. The number of transistors 114a–114n and the number of transistors 116a–116n may be selected to meet the design criteria of a particular application.

Figure 5B:
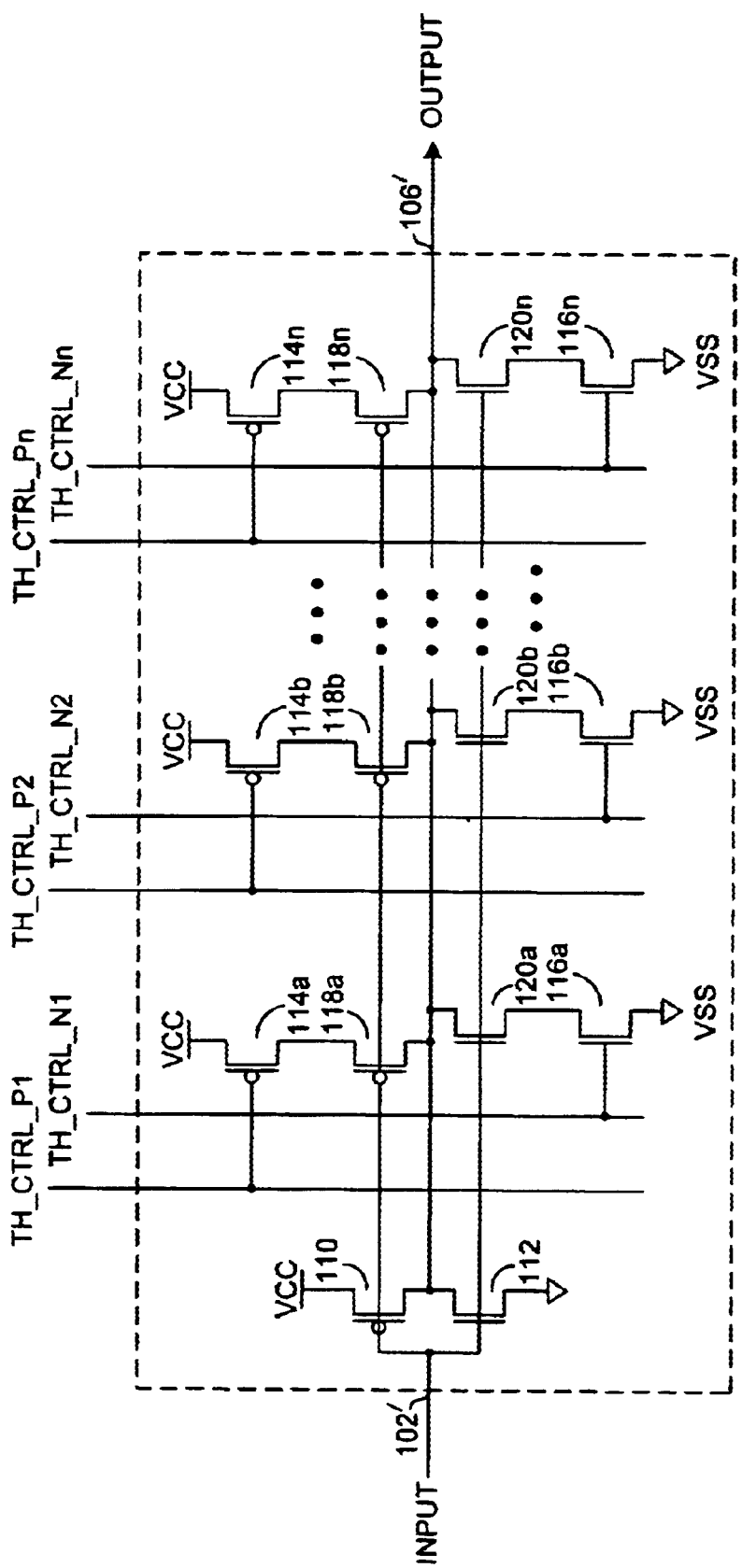
FIG. 5b is a schematic diagram of an alternative implementation of the input circuit of FIG. 3.

Referring to FIG. 5b, a schematic diagram of a circuit 100' illustrating an alternative implementation of the circuit 100 is shown. The circuit 100' may be implemented similarly to the circuit 100 except that (i) the transistors 114a–114n and 118a–118n may alternate positions and (ii) the transistors 116a–116n and 120a–120n may alternate positions.

Figure 6:
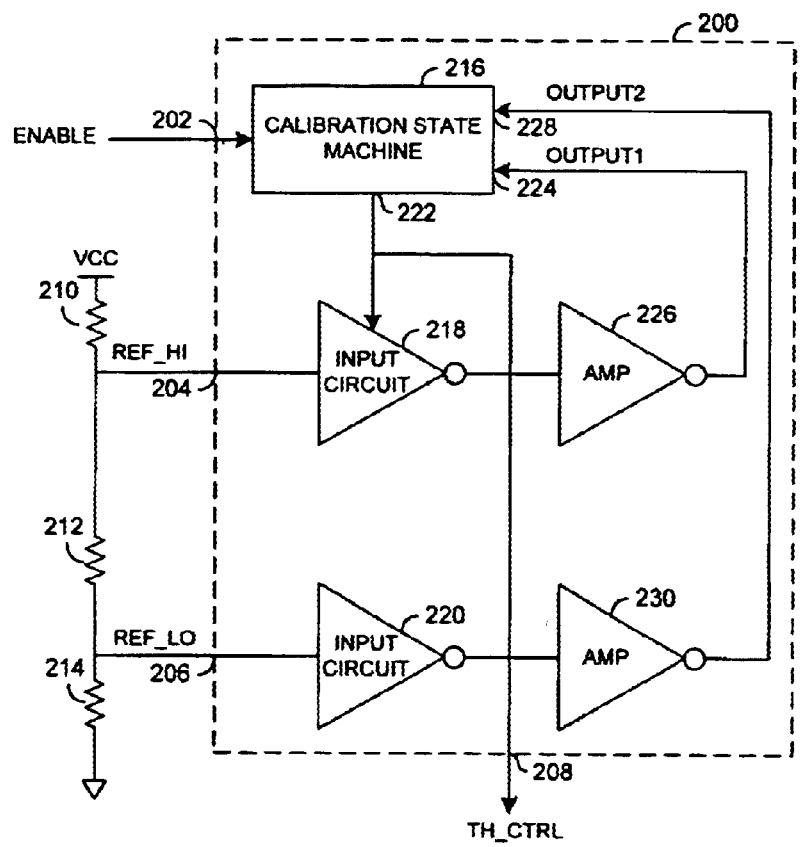
FIG. 6 is a block diagram illustrating a calibration circuit in accordance with a preferred embodiment of the present invention.

Referring to FIG. 6, a block diagram illustrating a circuit 200 in accordance with the present invention is shown. The circuit 200 may be, in one example, a calibration circuit. The circuit 200 may have an input 202 that may receive a signal (e.g., ENABLE), an input 204 that may receive a signal (e.g., REF_HI), an input 206 that may receive a signal (e.g., REF_LO), and an output 208 that may present the signal TH_CTRL. The signal ENABLE may be implemented, in one example, as a control signal. For example, the signal ENABLE may be used to initiate a power on reset (POR) or a user requested calibration. The signals REF_HI and REF_LO may be reference signals. The signal REF_HI may be a high threshold reference. The signal REF_LO may be a low threshold reference. The signals REF_HI and REF_LO may represent, in one example, fractions of the supply voltage VCC. For example, the signal REF_HI may have a first voltage level (e.g., VCC*0.52) and the signal REF_LO may have a second voltage level (e.g., VCC*0.48). The signals REF_HI and REF_LO may be implemented as reference voltages of an I/O standard (e.g., TTL, CMOS, etc.). The signals REF_HI and REF_LO may be generated, in one example, by a voltage dividing network. The network may comprise, in one example, a resistor 210, a resistor 212, and a resistor 214 connected in series between the supply voltage VCC and the voltage supply ground VSS. The resistors 210–214 may have predetermined resistance values selected to generate the signals REF_HI and REF_LO having predetermined voltage levels. The circuit 200 may be configured to generate the signal TH_CTRL in response to the signal ENABLE and one or more reference signals REF_HI and REF_LO. The circuit 200 may be implemented along with one or more of the circuit 100 to provide a chip with self-calibrating, zero DC power precision input thresholds.

The circuit 200 may comprise a circuit 216, a circuit 218, and a circuit 220. The circuit 216 may be implemented, in one example, as a calibration state machine. The circuits 218 and 220 may be implemented, in one example, similarly to the circuit 100. The signal ENABLE may be presented to an input of the circuit 216. The circuit 216 may have an output 222 that may present the signal TH_CTRL. The circuit 218 may have a first input that may receive the signal REF_HI, a second input that may receive the signal TH_CTRL, and an output that may present a signal (e.g., OUTPUT1) to an input 224 of the circuit 216. In one example, when additional gain is required, an amplifier 226 may be used to couple the output of the circuit 218 to the input 224. The circuit 220 may have a first input that may receive the signal REF_LO, a second input that may receive the signal TH_CTRL, and an output that may present a signal (e.g., OUTPUT2) to an input 228 of the circuit 216. In one example, when additional gain is required, an amplifier 230 may be used to couple the output of the circuit 220 to the input 228.

When the signal ENABLE is asserted (e.g., a logic HIGH, or 1), the circuit 216 may be configured to adjust the signal TH_CTRL until the signals OUTPUT1 and OUTPUT2 are in a predetermined state. In one example, the signal TH_CTRL may be adjusted to set the input threshold between the levels of the signal REF_LO and the signal REF_HI (e.g., the OUTPUT1 is a logic HIGH and the signal OUTPUT2 is a logic LOW). In another example, the signal TH_CTRL may be adjusted so that the signals OUTPUT1 and OUTPUT2 are generally within a predetermined range of the signals REF_HI and REF_LO, respectively.

The transistors of an integrated circuit (IC) may be tightly matched. The signal TH_CTRL may be presented to all the input circuits of an integrated circuit to calibrate the threshold of each input circuit similarly to the circuits 218 and 220. When the signal ENABLE is de-asserted, the signal TH_CTRL is generally maintained at the adjusted value and the circuit 200 generally consumes no power. The signal TH_CTRL may be preserved, in one example, by a memory circuit. The memory circuit may be nonvolatile or other appropriate type to meet the design criteria of a particular application.

Figure 7:
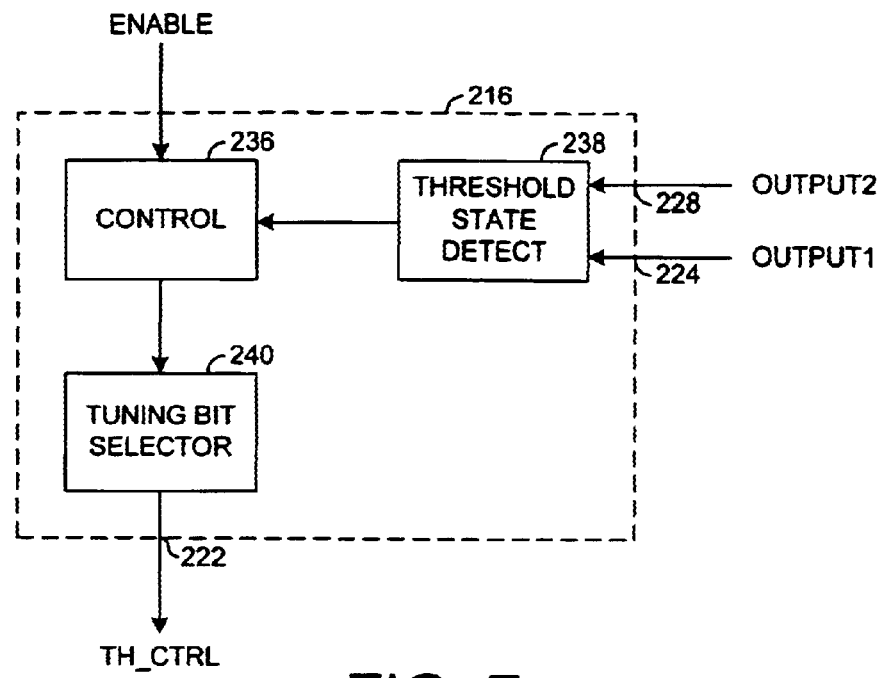
FIG. 7 is a detailed block diagram illustrating a calibration state machine circuit of FIG. 7.

Referring to FIG. 7, a more detailed block diagram of the circuit 216 of FIG. 6 is shown. The circuit 216 may be configured to adjust the signal TH_CTRL until each of the signals OUTPUT1 and OUTPUT2 are in a desired state. In one example, the desired states may include the signal OUTPUT1 having a logic HIGH state and the signal OUTPUT2 having a logic LOW state.

The circuit 216 may comprise a circuit 236, a circuit 238, and a circuit 240. The circuit 236 may be, in one example, a control circuit. The circuit 238 may be, in one example, a threshold state detect circuit. The circuit 240 may be, in one example, a tuning bit selector circuit.

The signal ENABLE may be presented to the circuit 236. When the signal ENABLE is asserted (e.g., HIGH), the circuit 236 may be configured to determine whether an output of the circuit 238 (e.g., a threshold state signal) indicates that the signals OUTPUT1 and OUTPUT2 are in the desired states. The circuit 238 may be configured to generate the output in response to the signals OUTPUT1 and OUTPUT2. The circuit 236 may be configured, in one example, to generate a control signal in response to the output of the circuit 238. The control signal from the circuit 236 may be presented to an input of the circuit 240. The circuit 240 may be configured to step through a number of combinations for the signal TH_CTRL in response to the control signal from the circuit 236. When the circuit 236 determines that the state of the signals OUTPUT1 and OUTPUT2 are in the desired states, the circuit 236 may control the circuit 240 to maintain the present selected value for the signal TH_CTRL.

Figure 8:
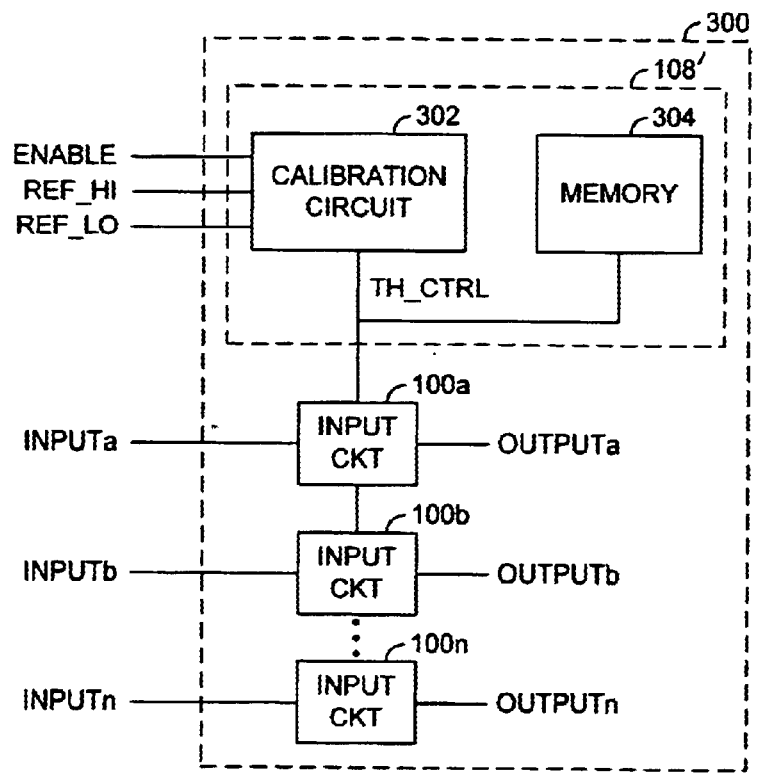
FIG. 8 is a block diagram illustrating an implementation of an embodiment of the present invention.

Referring to FIG. 8, a block diagram illustrating the input circuit 100 and the calibration circuit 108 implemented in the context of an integrated circuit 300 is shown. The integrated circuit 300 may comprise a number of input circuits implemented similarly to the circuit 100 (e.g., 100a–100n) and a calibration circuit 108'. The calibration circuit 108' may contain a calibration control circuit 302 and a memory circuit 304. The circuit 302 may be implemented similarly to the circuit 200 of FIG. 6. The signals ENABLE, REF_HI, and REF_LO may be presented to the calibration circuit 302.

The calibration circuit 302 may be configured to generate the signal TH_CTRL in response to the signals ENABLE, REF_HI and REF_LO. The signal TH_CTRL may be presented to each of the input circuits 100a–100n and the memory circuit 304. The calibration circuit 302 may be switched on in response to the signal ENABLE. The calibration circuit 302 may be configured, in one example, to set the signal TH_CTRL on power-up or in response to a user initiated calibration request. Once the calibration has been completed, the circuit 302 may be switched off and the signal TH_CTRL may be maintained using the memory circuit 304.

The memory circuit 304 may comprise, in one example, non-volatile memory cells and/or volatile memory cells. When the circuit 304 comprises non-volatile memory cells, the signal TH_CTRL may be generated by the memory 304 without switching the circuit 302 on for re-calibration. When the circuit 302 comprises volatile memory cells, a re-calibration using the circuit 302 may be initiated with each power-up to reset the value stored in the memory 304.

The present invention may provide a method and/or architecture for a self-calibrating, zero power precision input threshold circuit that may provide (i) a precise input threshold voltage, (ii) no standby power consumption after calibration is completed, (iii) self-calibrating input circuits, (iv) efficient area implementation of precision threshold input circuits, (v) tight thresholds over many inputs without multiplexing, (vi) user initiated re-calibration, (vii) a threshold set to either an absolute value or a percentage of supply voltage level, (ix) no additional external components required, and/or (x) an input circuit that may be calibrated during or after the manufacturing process.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an input circuit (a) comprising a number amplifier stages having inputs coupled together and outputs coupled together and (b) configured to generate an output signal in response to (i) an input signal and (ii) a first control signal, wherein said output signal changes state at different levels of said input signal in response to different settings of said first control signal; and
   a calibration circuit configured to adjust said first control signal in response to a (i) second control signal and (ii) one or more reference signals comprising a fraction of a supply voltage.

2. The apparatus according to claim 1, wherein said first control signal comprises two or more bits.

3. The apparatus according to claim 2, wherein said bits are configuration bits.

4. The apparatus according to claim 1, wherein said first control signal is adjusted during manufacture according to predetermined criteria.

5. The apparatus according to claim 2, wherein said bits are stored in a memory circuit.

6. The apparatus according to claim 5, wherein said memory circuit comprises non-volatile storage elements.

7. The apparatus according to claim 1, wherein said different levels of said input signal comprise a high voltage level and a low voltage level configured to provide hysteresis to said input circuit.

8. The apparatus according to claim 1, wherein said one or more reference signals comprise a reference voltage of a TTL I/O standard or a CMOS I/O standard.

9. The apparatus according to claim 1, wherein said calibration circuit comprises a state machine.

10. The apparatus according to claim 1, wherein each of said amplifier stages has a different gain and is switched on or off in response to said first control signal.

11. An apparatus comprising:
    means for generating an output signal in response to (i) an input signal and (ii) a first control signal, said generating means comprising a number of amplifier stages having inputs coupled together and outputs coupled together, wherein said output signal changes states at different levels of said input signal in response to different settings of said first control signal; an
    means for adjusting said first control signal in response to (i) a second control signal and (ii) one or more reference signals comprising a fraction of a supply voltage.

12. A method for providing a self calibrating, zero DC power precision input threshold voltage comprising the steps of:
    (A) generating an output signal via a number of amplifier stages having inputs coupled together and outputs coupled together in response to an input signal and a first control signal;
    (B) changing states of said output signal at different levels of said input signal in response to different settings of said first control signal; and
    (C) adjusting said first control signal in response to (i) a second control signal and (ii) one or more reference signals comprising a fraction of a supply voltage.

13. The method according to claim 12, further comprising the step of:
    (D) storing said first control signal in a memory circuit.

14. The method according to claim 12, wherein step (B) comprises the sub-step of:
    (B-1) varying an amplification of said input signal in response to said first control input.

15. The apparatus according to claim 1, wherein said different levels of said input signal are configured in response to an on or off state of said amplifier stages.

16. The method according to claim 12, wherein said different levels of said input signal are configured in response to an on or off state of said amplifier stages.

17. The method according to claim 12, wherein step (C) further comprises the sub-steps of:
    (C-1) switching on a threshold state direct circuit in response to said second control signal;
    (C-2) adjusting said first control signal in response to said one or more reference signals; and
    (C-3) switching off said threshold state detect circuit.

18. The apparatus according to claim 1, wherein said apparatus further comprises a plurality of said input circuits configured to generate a plurality of said output signals in response to a plurality of said input signals and said first control signal.

19. The method according to claim 12, wherein:
    step (A) further comprises generating a plurality of said output signals in response to a plurality of said input signals and said first control signal.

20. The apparatus according to claim 1, wherein said one or more reference signals have levels corresponding to said different levels of said input signal.

* * * * *